(12) United States Patent
Radke

(10) Patent No.: US 9,654,141 B2
(45) Date of Patent: *May 16, 2017

(54) MEMORY DEVICES AND SYSTEMS CONFIGURED TO ADJUST A SIZE OF AN ECC COVERAGE AREA

(71) Applicant: Micron Technology, Inc., Boise, ID (US)

(72) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 272 days.

This patent is subject to a terminal disclaimer.

(21) Appl. No.: 14/148,019

(22) Filed: Jan. 6, 2014

(65) Prior Publication Data

US 2014/0189468 A1 Jul. 3, 2014

Related U.S. Application Data

(63) Continuation of application No. 13/768,203, filed on Feb. 15, 2013, now Pat. No. 8,627,180, which is a continuation of application No. 12/897,260, filed on Oct. 4, 2010, now Pat. No. 8,381,076, which is a continuation of application No. 11/384,965, filed on Mar. 20, 2006, now Pat. No. 7,810,017.

(51) Int. Cl.
*G11C 29/00* (2006.01)
*H03M 13/05* (2006.01)
*G06F 11/10* (2006.01)

(52) U.S. Cl.
CPC ......... *H03M 13/05* (2013.01); *G06F 11/1068* (2013.01)

(58) Field of Classification Search
CPC .......................... H03M 13/05; G06F 11/1068
USPC .................................................. 714/758, 769
See application file for complete search history.

(56) References Cited

U.S. PATENT DOCUMENTS

| | | |
|---|---|---|
| 5,077,737 A | 12/1991 | Leger et al. |
| 5,459,850 A | 10/1995 | Clay et al. |
| 5,729,497 A | 3/1998 | Pawlowski |
| 5,754,567 A | 5/1998 | Norman |
| 5,825,788 A | 10/1998 | Pawlowski |
| 5,862,154 A | 1/1999 | Pawlowski |
| 5,864,569 A | 1/1999 | Roohparvar |
| 5,960,453 A | 9/1999 | Pawlowski |
| 6,034,891 A | 3/2000 | Norman |
| 6,178,537 B1 | 1/2001 | Roohparvar |
| 6,279,072 B1 | 8/2001 | Williams et al. |
| 6,397,290 B1 | 5/2002 | Williams et al. |
| 6,906,961 B2 | 6/2005 | Eggleston et al. |
| 6,956,577 B2 | 10/2005 | Radke et al. |
| 7,409,623 B2 | 8/2008 | Baker et al. |
| 7,536,627 B2 | 5/2009 | Gross et al. |
| 8,402,325 B2 * | 3/2013 | Egner et al. .................. 714/704 |
| 2003/0037299 A1 | 2/2003 | Smith |
| 2004/0153817 A1 | 8/2004 | Norman |
| 2004/0210709 A1 | 10/2004 | Conley et al. |

(Continued)

*Primary Examiner* — Sam Rizk
(74) *Attorney, Agent, or Firm* — Dicke, Billig & Czaja, PLLC

(57) ABSTRACT

Memory devices and systems having an array of memory cells arranged in a plurality of sectors and a plurality of ECC coverage areas, and control circuitry configured to adjust a size of one or more of the ECC coverage areas.

20 Claims, 6 Drawing Sheets

SINGLE SECTOR

USER DATA 202     ECC 204

512 Bytes     12 Bytes
456 Symbols (9 bit Math)    10 Symbols

DUAL SECTOR

USER DATA 212     ECC 214

1024 Bytes     25 Bytes
820 Symbols (10 bit Math)    20 Symbols

9 BIT MATH R-S CODE

DETECT 6 ERRORS
CORRECT 4 ERRORS

10 BIT MATH R-S CODE

DETECT 11 ERRORS
CORRECT 9 ERRORS

(56) References Cited

U.S. PATENT DOCUMENTS

2005/0005193 A1    1/2005   Nakagawa et al.
2005/0160217 A1    7/2005   Gonzalez et al.
2005/0268203 A1   12/2005   Keays
2005/0283650 A1   12/2005   Zhang et al.

* cited by examiner

MEMORY DEVICES AND SYSTEMS CONFIGURED TO ADJUST A SIZE OF AN ECC COVERAGE AREA

RELATED APPLICATIONS

This application is a Continuation of U.S. patent application Ser. No. 13/768,203, titled "MEMORY CONTROLLER ECC," filed Feb. 15, 2013 (now U.S. Pat. No. 8,627,180), which is a Continuation of U.S. patent application Ser. No. 12/897,260, titled "VARIABLE SECTOR-COUNT ECC," filed Oct. 4, 2010 (now U.S. Pat. No. 8,381,076), which is a Continuation of U.S. patent application Ser. No. 11/384,965, titled "VARIABLE SECTOR-COUNT ECC," filed Mar. 20, 2006 (now U.S. Pat. No. 7,810,017), each of which is commonly assigned and incorporated herein by reference.

TECHNICAL FIELD

The present invention relates generally to integrated circuits and in particular the present invention relates to data error correction codes of memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively. Other types of non-volatile memory and storage include, but are not limited to, Polymer Memory, Ferroelectric Random Access Memory (FeRAM), Ovionics Unified Memory (OUM), Nitride Read Only Memory (NROM), and Magnetoresistive Random Access Memory (MRAM).

In memory and memory systems, error correction codes (ECC's) allow errors in the data stored in the memory to be detected and in many cases corrected. ECC codes include block codes, that are associated with a block of stored data (a memory data sector), and stream codes, that are typically utilized with streams of transmitted data. ECC codes include, but are not limited to, Hamming codes, Reed-Solomon (R-S) codes, Bose-Chaudhuri-Hochquenghem (BCH) codes, circular redundancy check codes (CRC, it is noted herein that CRC codes are often only utilized for error detection), Golay codes, Reed-Muller codes, Goppa codes, and Denniston codes. In most memories and memory systems, error detection and/or ECC code generation is accomplished via a dedicated ECC hardware (referred to herein as ECC generators or ECC generator/checkers) as the data is read in or out. Unlike error detection, error correction is typically a more difficult process and generally involves a time consuming algorithmic process. As a result, error correction of data that has been detected as corrupt is generally done by a microprocessor or specialized hardware that can be contained either in an external microprocessor, in an external memory controller or within the memory device itself.

The prevalence of errors in modern memory devices, and in non-volatile and Flash memory devices in particular, have been tending to increase with smaller device sizes, increased array density, lower operating voltages and through the storage of multiple data bits in memory cells via multiple charge storage centers/centroids per cell or through the use of multiple threshold voltage levels in multi-level cells (MLCs). In addition, increased active usage of non-volatile memory devices in electronic devices and increases in the amount and relative size (granularity) of the data being stored in these memory devices has tended to increase the incidence of operationally induced failures over long periods of active use due to due to physical damage, impurity migration, write fatigue, electrical transients, etc. This increase in the number of times data is written combined with the increasing prevalence in errors due to reductions in feature sizes can affect memory operation, data reliability and speed; slowing the data rate of the memory device or memory system as these errors are corrected and/or increasing the incidence of uncorrectable data errors when the number of bit errors exceed the limits of the ECC code's correction ability.

For the reasons stated above, and for other reasons stated below which will become apparent to those skilled in the art upon reading and understanding the present specification, there is a need in the art for improved ECC apparatus and methods that allows for improved correction of data in memories.

DETAILED DESCRIPTION

Figure 1:
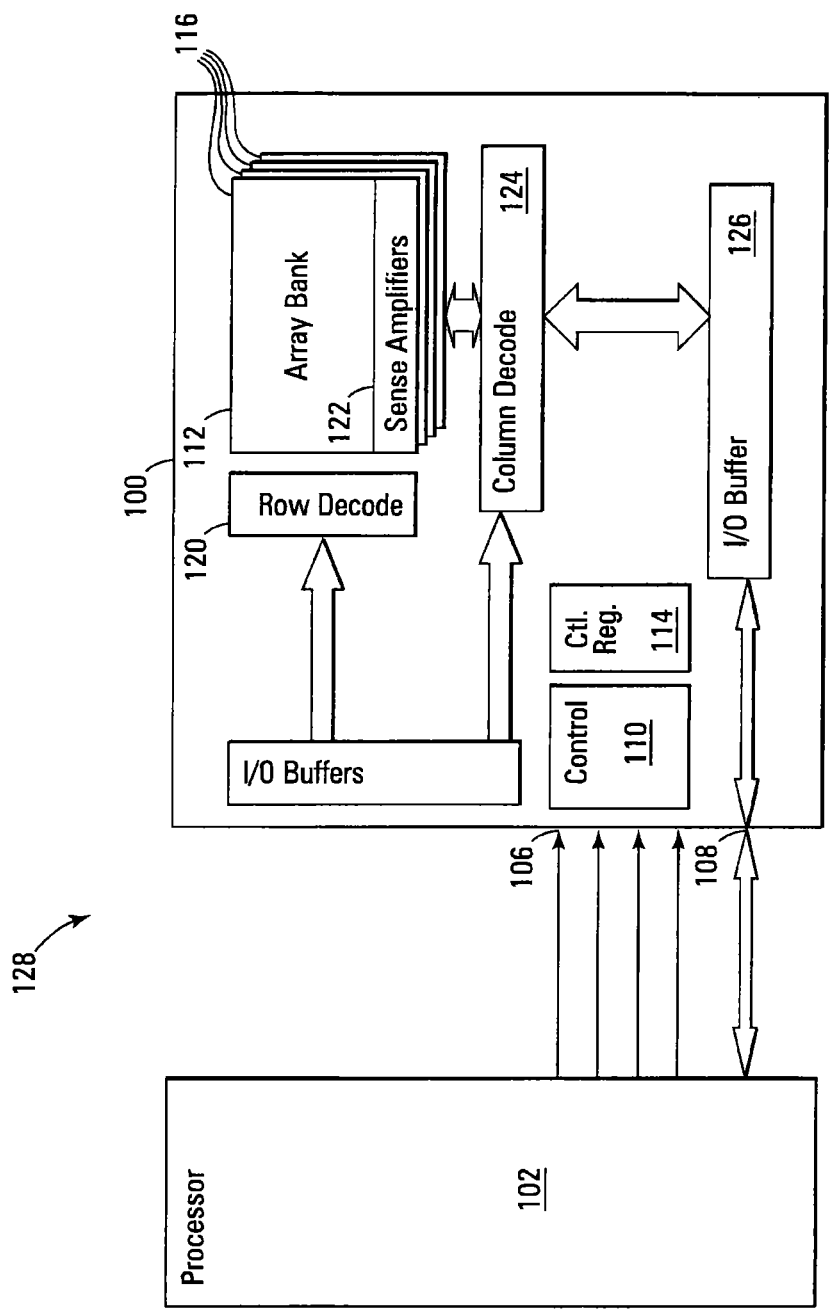
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Memory devices, control circuitry, or data handling routines, in accordance with embodiments of the present invention, facilitate the detection and correction of data in memory systems or devices by disassociating the user data structures being stored and the data size used for ECC to allow the ECC data size, coding, and algorithm to be selected based on the application, in effect, changing the granularity of the minimum data storage used for ECC for the purposes of efficient coverage. In one embodiment of the present invention the detection and correction of data errors in memory systems or devices is facilitated by increasing the data coverage area of the ECC codes (the ECC coverage area) to increase the relative size of the user data being covered by the same relative amount of ECC code storage. This approach averages any bit errors over a larger data area and allows for a greater number of errors to be detected and corrected in the increased data coverage area by the larger ECC code stored in the combined ECC code area, but does not substantially change the overall amount of ECC code data storage over a single sector based approach.

In another embodiment of the present invention, the size of the data block being utilized for ECC coverage is variable and can be selected such that differing memory devices, differing areas of the memory array, or differing memory areas storing differing types of data or having differing storage or use characteristics (such as requiring speed over increased error coverage or having increased error rates) can have a differing ECC data coverage block size. For example, a 4 sector ECC data grouping in one erase block, a 3 sector ECC data grouping in a second erase block, a 2 sector ECC data group in a third erase block, a single sector ECC data group in a fourth erase block, and a selected data space size and ECC grouping in a fifth erase block or memory array segment. It is also noted that the ECC algorithm, math base (9-bit, 10-bit, 11-bit, etc.), or encoding scheme (R-S, BCH, Hamming, etc.) can also be varied between these differing areas of the memory array.

In one embodiment of the present invention two 512 byte data sectors with separate 12 byte/10 symbol, 9-bit math ECC codes (each able to detect 6 individual errors and correct 4 of them within their associated single sectors), are now for ECC error detection and correction purposes combined in the embodiment to be two joined 512 byte sectors (or a single 1024 byte block) covered by a single joined ECC code having 25 bytes and being able to correct 9 errors and detect 11 in the combined 1024 byte ECC coverage space. In another embodiment of the present invention four 512 byte sectors and their ECC's are combined to allow for correction of up to 19 errors and the detection of 21 in the 2048 byte user data space covered.

Memory devices typically contain user data areas and overhead data areas. In particular, in non-volatile memory devices, such as Flash memory devices, each erase block typically contains user data areas and overhead data areas. The overhead data areas contain overhead information for operation of the erase block and/or the user data area the overhead data space is associated with. Such overhead information typically includes, but is not limited to, erase block management (EBM) data, or sector status information. In Flash memory devices each erase block is typically divided into a series of sectors, where the sectors each generally contain 512 bytes of user data space and an associated control or overhead area. One or more of the sectors are each typically written to a single row of the Flash memory array (also known as a physical page or column page or "page") within the erase block.

As stated above, modern memories are dealing with a greater incidence of errors in them. This is due to reductions in feature sizes, increased memory array/memory device densities, differing manufacturing processes, lower operating voltages, etc. In addition, in operating memory devices, electrostatic damage (ESD), write fatigue, electrical cross talk, and noise can also play a part in array damage or corruption of stored data. Therefore, the probability one or more bit errors in a given read memory segment or sector is increasing.

Typically, because of manufacturing related or use induced imperfections and errors, memory devices and other computer usable storage or media are abstracted by various software drivers, management routines, and hardware support circuitry to appear to their host systems as virtual perfect data storage, without errors or defective regions. This abstraction of the memory device or computer usable storage generally accomplished through the marking of bad memory blocks, replacement of defective blocks or memory elements with spare/redundant blocks or elements, and through the use of error correction methods, such as ECC codes, to detect and correct data errors in the retrieved data. However, these redundant elements are expensive to include and take away from the space available for the memory array, therefore there are limits to what can be fixed in a given memory device by such methods, particularly given the density of current memory devices.

As a result of the increased incidence of errors, memory controllers and embedded ECC systems currently are being asked to deal with an increased number of situations where error correction is required. However, the data space reserved for the ECC code storage is generally remaining the same, while the number of errors that the ECC codes and algorithms are being asked to detect and correct are increasing. As a result, the rate of unrecoverable errors in the memory system or device is increasing appreciably as the incidence of errors increases.

As stated above, memories typically utilize ECC codes to detect and correct a limited number of errors in stored user data. ECC codes, and block ECC codes in particular, are commonly based on specialized polynomial equations, where the stored ECC codes are the generated coefficients of a polynomial for the current data. When the data is read out of a memory the data integrity is checked by regenerating these coefficients from the read data; serially running the read data through a hardware ECC generator/checker to regenerate the ECC code, and comparing them against the coefficients in the stored ECC code. If the generated and stored ECC codes do not match an error has been detected. Once an error in read data is detected, the transfer of the data out of the memory device or system is halted and ECC correction algorithm is started. The ECC correction algorithm, generally speaking, solves for the zeros of the polynomial to locate the data word(s) and bit(s) within the data words that need to be corrected.

In utilizing error correction methodologies in memory devices or other computer usable storage, it would be desirable to be able to correct an infinite number of errors. However, for each error the ECC code/memory device can correct there is an overhead cost. These overhead costs come in the form of increased storage space required for storing the ECC codes to allow detection and correction errors in the stored data, and in increased size and complexity of the hardware circuits and/or software routines required to utilize the ECC codes and reduced speed of operation. In addition, ECC codes and algorithms are typically designed to allow for the detection of more errors than they can correct for in order to increase operational stability in the ECC algorithm. As such, efficient and practical ECC code error correction is typically limited by storage space requirements, and by complexity and speed of use of the selected ECC codes and algorithms. On the other hand, the actual incidences of individual symbol errors in prior art memory devices or computer usable storage has typically been low, so that the statistical odds of having more than a limited number of bit errors in a 512-byte sector of user data has been typically low enough in the past so that a limited ECC error detection and correction ability (thus having low additional storage requirements and a high speed of operation) has been sufficient for abstraction purposes. As stated above, with increasing data storage density in modern memory devices, decreased process feature sizes and memory cell spacing, there will generally be an increasing level of bit errors in the stored data.

In the past, ECC codes in memory devices or computer usable storage have traditionally been utilized on a per-sector basis, where each sector of 512 bytes of data has an ECC code associated with it to detect and correct a limited number of errors that occur in the sector. This corresponded with the typical user data structure being stored and retrieved in these devices (a sector) and, in many cases, matched the row size (also known as the physical page size) of the memory devices being utilized, allowing for convenience and speed in data storage and retrieval in these devices. With improvements in modern memory technology and manufacturing processes, many modern memory devices, in particular non-volatile memory devices, now can store four or more sectors on a row/physical page of their memory arrays, with further page size increases likely forthcoming. Yet in these devices ECC coding is still done on per sector basis.

FIG. 1 details a simplified diagram of a system 128 incorporating of an embodiment of the present invention, having a memory device 100 connected to a host 102, which is typically a processing device or memory controller. The memory 100 has a control interface 106 and an address/data interface 108 that are each connected to the processing device 102 to allow memory read and write accesses. It is noted that in alternative embodiments, the address/data interface 108 can be divided into separate interfaces. Internal to the memory device a control state machine/control circuit 110 directs the internal operation; managing the memory array 112 and updating RAM control registers 114. The RAM control registers and tables 114 are utilized by the control state machine 110 during operation of the memory 100. The memory array 112 contains a sequence of memory banks or segments 116. Memory access addresses are received on the address/data interface 108 of the memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are connected from a local bitline/string (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit 124 selects write sense amplifiers 122. Data values to be written are connected from the data buffer 126 to the data cache and then to the write data latches of the write sense amplifiers 122 selected by the column decode circuit 124 and written to the selected memory cells (not shown) of the memory array 112. In one embodiment, the written cells are then reselected by the row and column decode circuits 120, 124 and sense amplifiers 122 so that they can be read to verify that the correct values have been programmed into the selected memory cells. It is noted that in another embodiment of the present invention, the column decode 124 may be optionally placed between the memory array 112 and the sense amplifiers 122.

As stated above, one type of non-volatile memory is a Flash memory. A Flash memory is a type of EEPROM that is typically erased and reprogrammed in blocks instead of one byte at a time. A typical Flash memory comprises a memory array, which includes a large number of non-volatile memory cells. Each of the memory cells typically includes a conductive floating gate (or non-conductive floating node/charge trapping layer) field-effect transistor (FET) capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

It is noted that embodiments of the present invention are not limited to NAND or NOR architecture memory arrays or memory devices and can apply to other block erasing memory array architectures and memory devices, including, but not limited to AND and virtual ground architecture memory arrays and memory devices.

Because all the cells in an erase block of a Flash memory device are generally erased all at once, one cannot directly rewrite a Flash memory cell without first engaging in a block erase operation. EBM, typically under the control of an internal state machine, an external Flash memory controller, or software driver, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

In many modern Flash memory device implementations, the host interface and Erase Block Management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk.

Memory devices, control circuitry, or data handling routines, in accordance with embodiments of the present invention, facilitate the detection and correction of data in memory systems or devices by decoupling the user data structures being stored and the base data size being utilized for ECC to allow the ECC data size, coding, and algorithm to be selected based on the requirements of the application (such as either an increase error coverage or speed of operation). In one embodiment of the present invention, ECC detection and correction is increased by enlarging the data area or block size of user data being covered by the ECC code symbols (the ECC coverage area) larger than the base stored user data structure size (e.g., single sector user data storage with a multiple sector ECC coverage area). This averages the possible bit errors that may occur in the ECC coverage area over a larger amount of user data and allows a greater number of errors to be detected and corrected within this larger ECC coverage area but have the same ECC code storage space as a single sector based approach.

In one embodiment, a memory controller, memory system or memory device contains an ECC coverage area (or ECC data block) that differs from the base stored user data structure size. In another embodiment, a memory controller, memory system or memory device tags memory structures, such as, but not limited to, sectors, pages, erase blocks, memory segments, and memory array banks to identify the base ECC coverage area and ECC encoding utilized in the memory structure. In yet another embodiment, differing memory devices in a memory system utilize differing base ECC coverage areas and ECC encodings. In a further embodiment, a different base ECC coverage area and ECC encoding is utilized dependent on the type of memory being utilized and/or the data being stored, such as a MLC NAND Flash storing digital images (having a low data reliability requirement), an EEPROM storing boot code (requiring high data reliability), or a DRAM utilized as scratch pad memory (having a high access speed/low data reliability requirement). In yet a further embodiment, the ECC coverage area and coding is adaptive based on the number of errors (the bit error rate) and/or use level of the underlying memory area, such that as a memory area experiences an increasing wear level, increasing number of bit errors, or increasing number of unrecoverable data errors, the ECC coverage area and coding scheme utilized in the area is increased to allow for greater data reliability. In some cases, this increased ECC coverage area and correction ability can be utilized by the memory device or system as an alternative to marking the memory area as bad and requiring that it be removed from use.

Reed-Solomon error correction block codes are one of a number of block codes commonly utilized in memory device applications and embodiments of the present invention. It is noted that preferred embodiments of the present invention utilize Bose-Chaudhuri-Hochquenghem (BCH) based ECC codes and algorithms, such as Reed-Solomon (R-S) codes. However, it is also noted that they can utilize other ECC codes, including, but not limited to, Hamming codes, circular redundancy check codes (CRC), Golay codes, Reed-Muller codes, Goppa codes, and Denniston codes. As stated above, with a block code generator, a block of data is fed into the block code generator to generate the ECC code to be stored associated with the data block in the memory device.

In one prior art ECC generator/checker, a Reed-Solomon code generator is fed a data sector of 512 bytes and generates ten 9-bit symbols (formatted into a 12 byte code) that form the ECC code to tag on to the end of the data block. From these ten 9-bit symbols of the 12 byte ECC code it is typically possible to detect 6 errors and correct 4 in the data sector as it is read from the memory device. As noted above, to promote stability in the ECC algorithm operation and prevent valid, but incorrect, ECC error correction solutions, ECC coding schemes are sometimes chosen so that they can detect more errors than they can correct as a safety margin.

ECC code generators typically serialize the data block into a data stream to generate the ECC code. A similar process is also generally utilized to check a read data block by regenerating the ECC code from the read data block and evaluating it against the stored associated ECC code. In generating an ECC code from a data sector/data block, the ECC code generator divides the user data of the stored data block into symbols of the same math base (such as 9-bit data symbols) as the ECC code it was stored with.

In checking data block and its associated ECC code, the ECC code generator/code check hardware produces a stream of binary digits (Syndrome generation) in what is known as a Linear Feedback Shift Register (LFSR) code. If the stream of binary digits is all zeros, no errors have been detected in the read data block. If one or more non-zero bits are output, there is an error and further processing is required by the ECC correction algorithm to try to determine the location of the error(s) and correct them.

In determining the location of the errors, an ECC algorithm (such as a BCH-based Reed-Solomon code) utilizes the stored symbols of the ECC code and solves for the zeros of the error location polynomial to locate the symbol(s) in the data block that are corrupted and the bit(s) within that symbol that are incorrect. In doing so, it utilizes a Berlekamp Algorithm to solve a series of equations to find the zero's of the error location polynomial in Galois fields in $2^N$ space. A Chien search is then conducted, by inserting these zeros into each location to see if this is one of the bit locations that satisfies the error solution.

In embodiments of the present invention, the ECC data coverage area, math base of the symbols, and ECC algorithms of ECC generator/checkers are preferably designed for the largest ECC data coverage area being utilized in the embodiment. For use with smaller ECC data coverage areas or in embodiments with variable ECC coverage areas, the data space and algorithm loops are truncated so that only the symbols contained within these smaller ECC data coverage areas are utilized in generating and checking the ECC. However, it is noted that a different LFSR register may be required for each different ECC coverage size. It is also noted that changing between differing symbol math bases and ECC encoding schemes within the embodiment (such as, from 9-bit symbols to 10-bit symbols or Hamming codes to R-S codes) can cause there to be a change the base ECC algorithms and/or hardware.

Figure 2A:
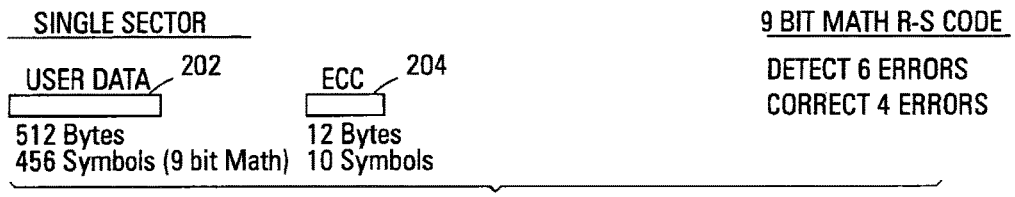
FIGS. 2A, 2B, 2C and 2D detail user data and their associated ECC codes in accordance with embodiments of the present invention.

FIG. 2A details a data sector 202 and its associated 9-bit math Reed-Solomon ECC code 204. In FIG. 2A, the user data is stored in a 512-byte sector 202 that is concurrent with the ECC coverage area and is divided into 456 9-bit symbols for ECC purposes. The ECC code 204 contains ten 9-bit symbols stored in 12 bytes. The Reed-Solomon ECC encoding of the single data sector/ECC coverage area 202 and ECC code 204 allows for the detection of 6 symbol errors and the correction of 4 symbol errors. It is noted that this encoding includes an additional error detection margin of 2 bits over the 4 bit correction ability to help foster predictable and stable operation of the ECC error correction.

Figure 2B:
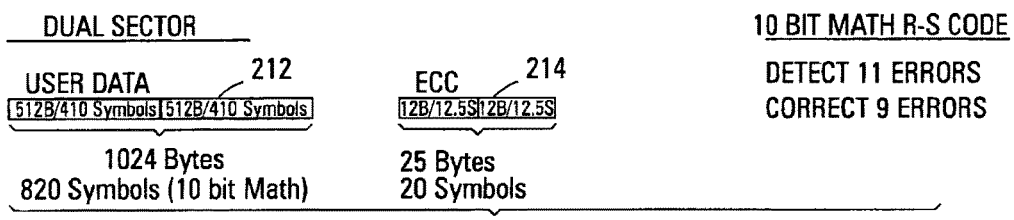

FIG. 2B details a dual sector ECC coverage area 212 and its associated 10-bit math Reed-Solomon ECC code 214 of an embodiment of the present invention. In FIG. 2B, the user data is stored in two 512-byte sectors 212 that are grouped together to form a single 1024 byte ECC coverage area having 820 10-bit symbols for ECC purposes. The ECC code 214 contains 20 10-bit symbols stored in a 25 byte joined ECC code area. The Reed-Solomon ECC encoding of the dual data sector/ECC coverage area 212 and associated ECC code 214 with 10-bit math allows for the detection of 11 errors and the correction of 9 errors in one embodiment of the present invention. It is noted that this encoding includes the same 2 error detection margin over the correction ability to help foster predictable and stable operation of the ECC error correction. However, due to the combined dual sector coverage, this 2 error detection margin is for the dual sector ECC coverage area, as a whole, and does not need to be repeated for both sectors. The excess coding ability thus freed up allows for an increase in the error correction ability of the combined ECC code 214 to be able to correct for 9 errors in the dual sector 212 instead of a linear increase of 8 bits. Even without taking advantage of this ability to decrease the error detection margin in the error correction, since the error correction ability for the combined dual sector 212 is now combined, and since that bit errors are typically random and occur at a constant, infrequent, rate throughout the memory area being covered, statistically we have a much greater error detection and correction ability for the dual sector ECC coverage area 212 than in a single sector approach (i.e., the statistical odds of an additional bit error occurring within a given data area is smaller with higher numbers of errors, such that the odds of a 2-bit error occurring in an ECC coverage area is less than the occurrence of a 1-bit error, a 3-bit error even less so, etc.). In other words, we are much less likely to have more than 8 bit errors in 2 sectors than more than 4 bit errors in 1 sector. However, we do increase the complexity of the resulting ECC algorithm and/or associated hardware, decreasing access speed.

Figure 2C:
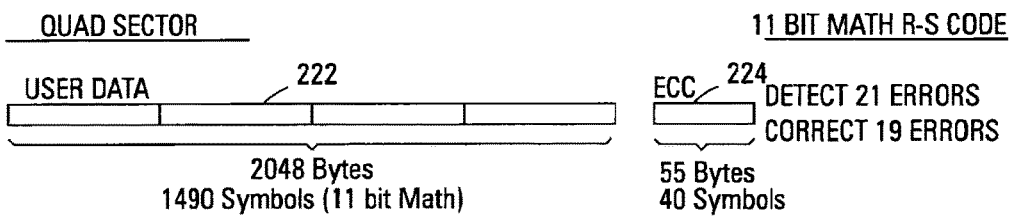

FIG. 2C details a quad sector ECC coverage area 222 and associated 11-bit math Reed-Solomon ECC code 224 of another embodiment of the present invention. In FIG. 2C, the user data is stored in four 512-byte sectors 222 that are grouped together to form a single 2048 byte ECC coverage area of 1490 11-bit ECC symbols. The ECC code 224 contains 40 11-bit symbols stored in a 55-byte ECC code storage area. The Reed-Solomon ECC encoding of the quad data sector/ECC coverage area 222 and associated ECC code 224 with 11-bit math allows for the detection of 21 errors and the correction of 19 errors in one embodiment of the present invention.

Figure 2D:
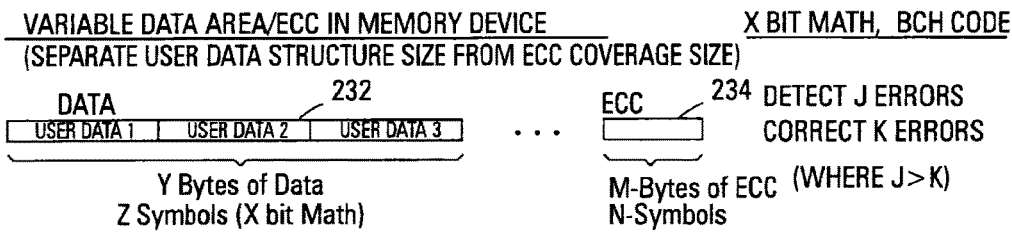

FIG. 2D details an embodiment of the present invention having a generalized ECC coverage area 232 storing Y-bytes of user data divided into Z ECC symbols using X-bit math and protected by an associated X-bit math BCH ECC code 234. It is noted that in one embodiment the size of the ECC coverage area 232 can be variable and set by the amount of data to be stored during the access or area of memory being utilized. The ECC code 234 contains N X-bit symbols stored in a M-byte ECC code storage area. The ECC encoding of the generalized ECC coverage area 232 and associated ECC code 234 allows for the detection of J symbol errors and the correction of K symbol errors (and thus their contained bit errors).

It is noted that other ECC coverage areas sizes, ECC encoding schemes and ECC codes of FIGS. 2A, 2B, 2C and 2D incorporating embodiments of the present invention will be apparent to those skilled in the art with the benefit of the present disclosure.

Figure 3A:
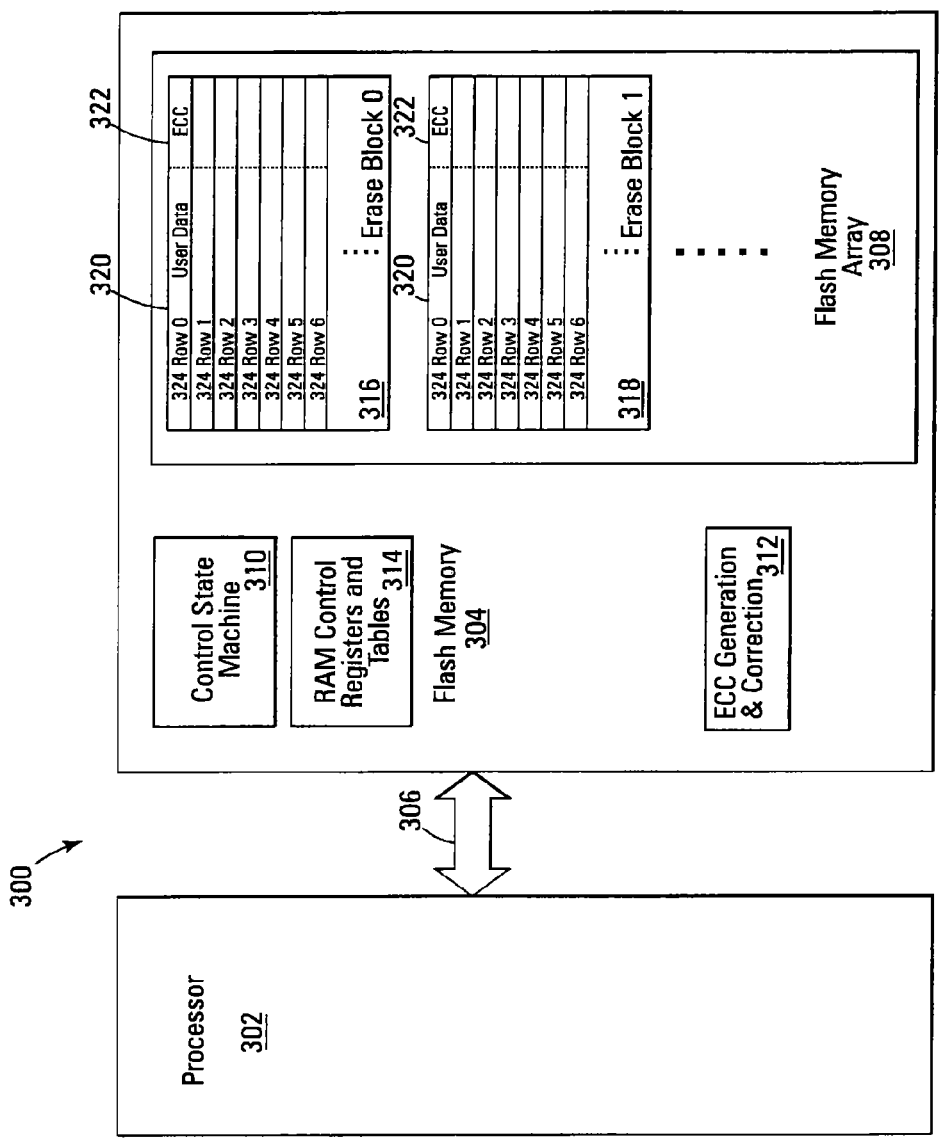
FIGS. 3A and 3B detail memory systems with memory and memory controllers with ECC generation, error check and correction circuits in accordance with embodiments of the present invention.

FIG. 3A is a simplified diagram of a system 300 that incorporates a Flash memory device 304 embodiment of the present invention. In the system 300 of FIG. 3A, the Flash memory 304 is coupled to a processor 302 with an address/data bus 306. Internally to the Flash memory device, a control state machine 310 directs internal operation of the Flash memory device; managing the Flash memory array 308 and updating RAM control registers and tables 314. The Flash memory array 308 contains floating gate memory cells arranged in a sequence of erase blocks 316, 318. Each erase block 316, 318 contains a series of physical pages, each page containing one or more logical sectors 324 (shown here for illustration purposes as a single logical sector 324 per physical page/row) that contain a user data space 320 and a control/overhead data space 322. The overhead data space 322 contains overhead information for operation of the sector 320, such as an error correction code (not shown), status flags, or an erase block management data field area (not shown). The RAM control registers and tables 314 are loaded at power up from the non-volatile erase block management registers and tables (not shown) by the control state machine 310. The user data space 320 in each logical sector 324 is typically 512 bytes long. It is noted that other interfaces to the Flash memory 304 and formats for the erase blocks 316, 318, physical pages, and sectors 324 are possible and should be apparent to those skilled in the art with benefit of the present disclosure. In FIG. 3A, the Flash memory 304 contains ECC generation and checking hardware 312 incorporating embodiments of the present invention.

Figure 3B:
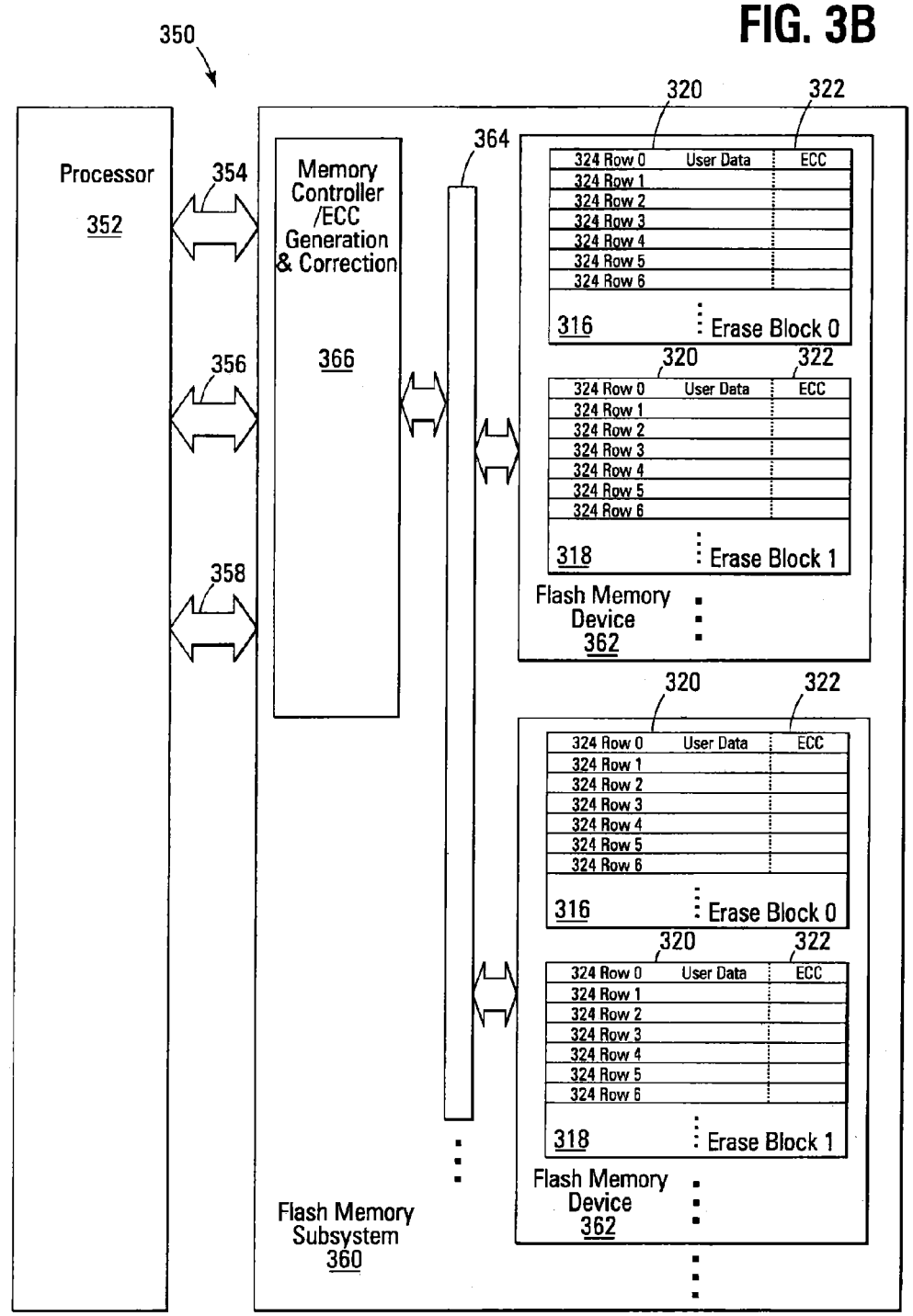

FIG. 3B is a simplified diagram of another system 350 that incorporates a Flash memory system 360 embodiment of the present invention. In the system 350 of FIG. 3B, the Flash memory system 360, such as a memory system or Flash memory card, is coupled to a processor 352 with an address 354, control 356, and data bus 358. Internal to the Flash memory system 360, a memory controller 366 directs internal operation of the Flash memory system 360; managing the Flash memory devices 362, directing data accesses, updating internal control registers and tables (not shown), and/or directing operation of other possible hardware systems (not shown) of the Flash memory system 360. The memory controller 366 has an internal ECC generation and checking hardware (not shown) that incorporates embodiments of the present invention. The memory controller 366 may optionally incorporate a small local embedded processor to help manage the Flash memory system 360. The memory controller 366 is coupled to and controls one or more Flash memory devices 362 via an internal control bus 364. It is noted that other architectures Flash memory systems 360, external interfaces 354, 356, 358, and manners of coupling the memory controller 366 to the Flash memory devices 362, such as directly coupled individual control busses and signal lines, are possible and should be apparent to those skilled in the art with benefit of the present disclosure.

The Flash memory devices 362 each contain a sequence of erase blocks 316, 318 in their internal memory arrays. Each erase block 316, 318 contains a series of physical pages, each physical page having one or more logical sectors 324 that contain a user data space 320 and a control/overhead data space 322 (shown here for illustration purposes as a single logical sector 324 per physical page/row).

The overhead data space 322 contains an ECC code (not shown) and other overhead information for operation of the logical sector 320, such as status flags, or an erase block management data field area (not shown).

It is noted that the ECC checking and correction of Flash memory embodiments of the present invention can apply to other non-volatile memory types including, but not limited to, polymer memory, multi-level cells (MLC) storage, NOR Flash, NAND Flash, virtual ground, FeRAM, OUM, NROM, and MRAM and should be apparent to those skilled in the art with the benefit of the present invention.

Figure 4:
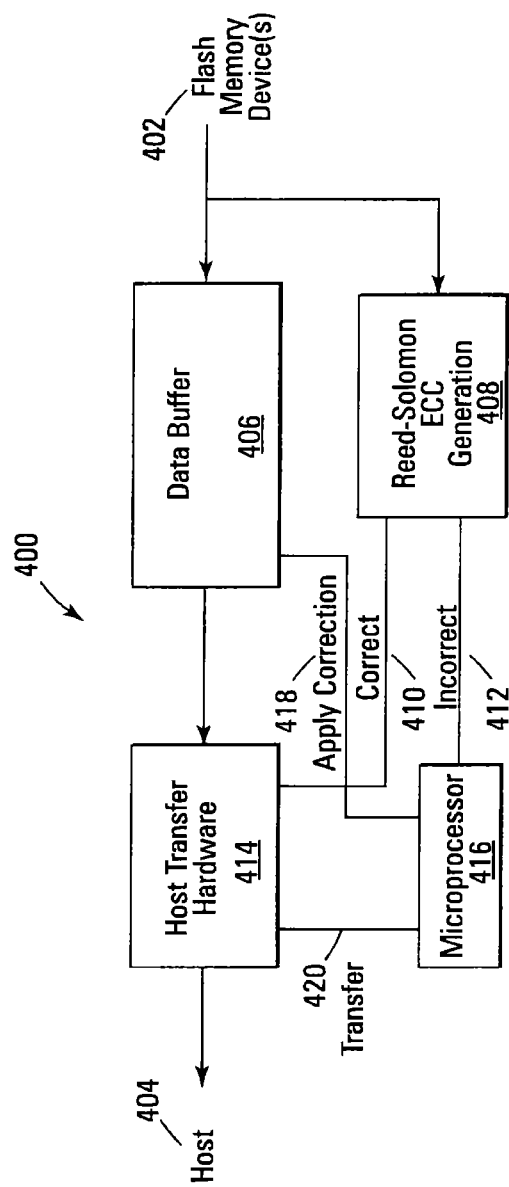
FIG. 4 details a Flash memory controller with ECC error check and correction circuits in accordance with an embodiment of the present invention.

FIG. 4 shows a simplified diagram of a memory controller output 400 of an embodiment of the present invention coupled through a memory interface 402 to one or more Flash memory devices and through a host interface 404 to an external host (not shown), which typically is a processor or computer system. In the memory controller 400, a data buffer 406 is coupled to serially receive and hold a selected data block that is serially read through the memory interface 402 from a selected Flash memory device before it is transferred from the data buffer 406 through the host interface 404 under control of the host transfer hardware 414. The serially streamed data block is also coupled to a Reed-Solomon ECC generator/checker hardware 408, which regenerates the ECC codes from the data block and checks them against the stored ECC codes attached at the end of the data block stream. Once the data block is read and evaluated, the Reed-Solomon ECC generator/checker hardware 408 signals 410 to the host transfer hardware 414 to start the data transfer if the data block is correct (the data block ECC codes have been generated and evaluated correctly against the stored ECC codes for the data block, typically generating a string of zeros from the Reed-Solomon ECC generation hardware 408). If the data block is corrupted (the generated data block ECC codes have evaluated incorrectly against the stored ECC codes for the data block, typically generating a non-zero value output from the Reed-Solomon ECC generation hardware 408) the Reed-Solomon ECC generator/checker hardware 408 signals 412 a (typically internal) microprocessor or dedicated ECC correction hardware 416 to correct the errors by utilizing a Reed-Solomon ECC correction algorithm. The microprocessor 416 solves the Reed-Solomon ECC correction algorithm, solving the Berlekamp polynomial, and executing a Chien search from the stored ECC code to determine the bits to be corrected in the data block and applies the correction 418 to the data block contents held in the data buffer 406. After applying the correction to the data buffer 406, the microprocessor 416 signals 420 the host transfer hardware 414 to begin transferring the data block from the data buffer 406 out through the host interface 404.

It is noted that, although the memory controller 400 is designed to be externally coupled to one or more Flash memory devices, memory outputs that are internal to a memory device incorporating embodiments of the present invention should be apparent to those skilled in the art with the benefit of the present disclosure. It is also noted that other embodiments incorporating differing ECC code schemes and math bases are also possible and should be apparent to those skilled in the art with the benefit of the present disclosure.

Figure 5:
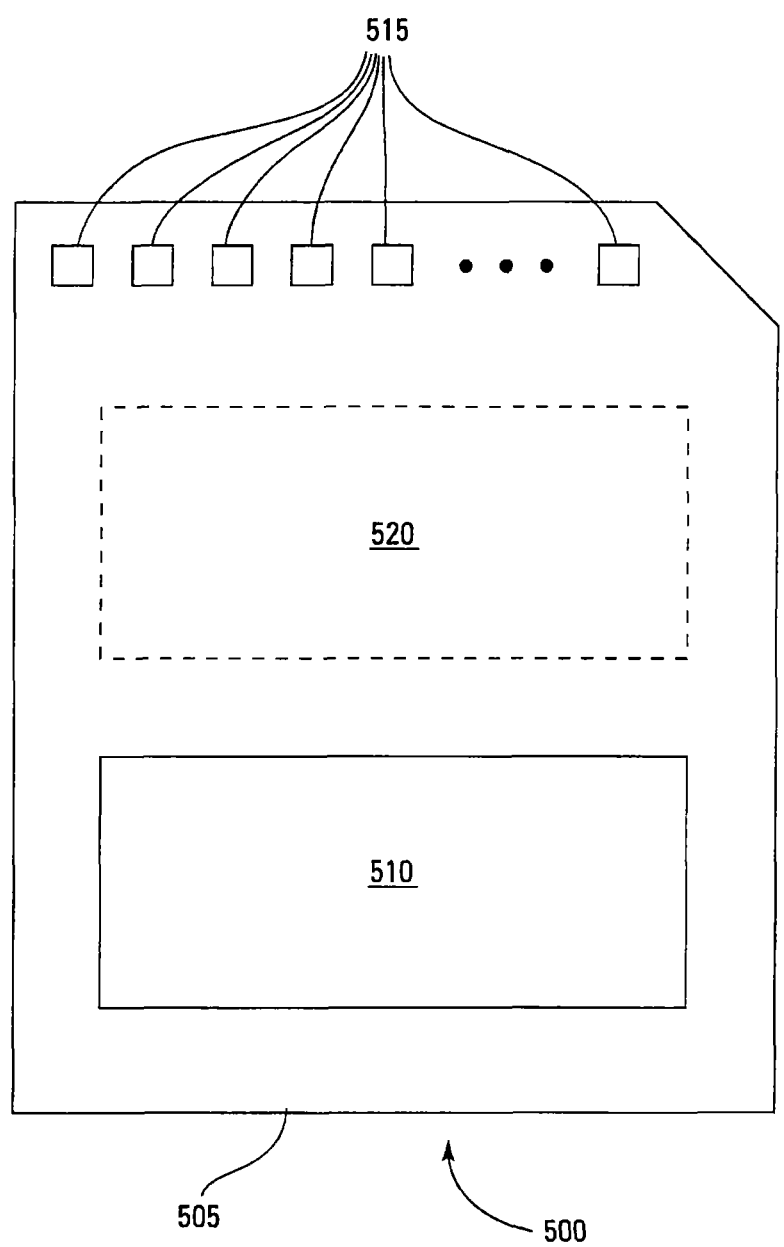
FIG. 5 is a simplified block diagram of a memory module in accordance with an embodiment of the present invention.

FIG. 5 is an illustration of an exemplary memory module 500. Memory module 500 is illustrated as a memory card, although the concepts discussed with reference to memory module 500 are applicable to other types of removable or portable memory, e.g., USB flash drives, and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 is a non-volatile memory including circuits of or adapted to perform elements of methods of the present invention. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520 which may be one or more integrated circuits and/or discrete components. For some embodiments, the additional circuitry 520 may include a memory controller for controlling access across multiple memory devices 510 and/or for providing a translation layer between an external host and a memory device 510. For example, there may not be a one-to-one correspondence between the number of contacts 515 and a number of I/O connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC (application specific integrated circuit). Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

It is also noted that other ECC error detection and correction sequences, methods, and circuits in memory embodiments of the present invention are possible and should be apparent to those skilled in the art with benefit of the present disclosure.

CONCLUSION

Improved memory devices, circuitry, and data methods have been described that facilitate the detection and correction of data in memory systems or devices by disassociating the user data structures being stored and the base data size being utilized for ECC to allow the ECC data size, coding, and algorithm to be selected based on the application. This allows the ECC being utilized to be selected for either increased error coverage or speed of operation. In one embodiment of the present invention, the data area or block size of user data being covered by the ECC code symbols is a fixed increased data size compared to the stored user data structure size (e.g., single sector user data storage with a multiple sector ECC coverage area). This averages the possible bit errors that may occur in the ECC coverage area over a larger amount of user data and allows a greater number of errors to be detected and corrected within this larger ECC coverage area by increasing the ECC code storage space through a simple combining of the sector-based ECC code storage space. This increases the ECC complexity but allows the overall data size of the ECC codes being stored to be equivalent to a single sector based approach with an increased bit error detection and correction ability. In yet another embodiment of the present invention, the size of the data block being utilized for ECC coverage is variable and can be selected such that differing areas of the memory array or areas storing differing data types can have a differing ECC data block size, selected for either increased data reliability and error coverage or speed of operation. For example, a 4 sector ECC data grouping in one erase block, a 2 sector ECC data group in a second erase block, a single sector ECC data group in a third erase block, and a selected data space size and ECC grouping in a fourth erase block or memory array segment.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   an array of memory cells arranged in a plurality of sectors, wherein the array of memory cells is further arranged in a plurality of ECC coverage areas; and
   control circuitry, wherein the control circuitry is configured to adjust a size of one or more of the ECC coverage areas.

2. The memory device of claim 1, wherein the control circuitry is further configured to adjust the size of one or more of the ECC coverage areas in response to a use characteristic of the memory device.

3. The memory device of claim 1, wherein the control circuitry is further configured to adjust the size of one or more of the ECC coverage areas based on a data type stored in the memory device.

4. The memory device of claim 1, wherein the control circuitry is further configured to adjust the size of one or more of the ECC coverage areas based on a bit error rate of a memory area of the memory device.

5. The memory device of claim 1, wherein each ECC coverage area has an associated ECC code, and wherein each ECC code is selected from a group consisting of a Hamming code, a Reed-Solomon (R-S) code, a Bose-Chaudhuri-Hochquenghem (BCH) code, a circular redundancy check code (CRC), a Golay code, a Reed-Muller code, a Goppa code, and a Denniston code.

6. The memory device of claim 5, wherein an ECC code associated with a particular ECC coverage area is different than an ECC code associated with a different ECC coverage area.

7. The memory device of claim 1, wherein the control circuitry is further configured to utilize two or more different ECC codes as an associated ECC code.

8. The memory device of claim 1, wherein the array of memory cells comprise an array of non-volatile flash memory cells arranged in one of a NAND architecture arrangement and a NOR architecture arrangement.

9. The memory device of claim 1, wherein the array of memory cells comprises an array of DRAM memory cells.

10. The memory device of claim 1, wherein the control circuitry is further configured to adjust a first ECC coverage area to a first coverage size and adjust a second ECC coverage area to a second coverage size different than the first coverage size.

11. The memory device of claim 1, wherein a particular ECC coverage area has a size that differs from a base stored user data structure size of the memory device.

12. The memory device of claim 11, wherein the size of the particular ECC coverage area is larger than the base stored user data structure size.

13. The memory device of claim 1, wherein each ECC coverage area comprises an integer number of sectors of the plurality of sectors.

14. The memory device of claim 13, wherein the integer number of sectors of the plurality of sectors is two or more.

15. The memory device of claim 1, wherein the array of memory cells are further arranged in a plurality of blocks, wherein at least two or more blocks comprise different ECC coverage sizes.

16. The memory device of claim 15, wherein the at least two or more blocks utilize different ECC codes.

17. A memory device comprising:
   an array of memory cells arranged in a plurality of sectors, wherein the array of memory cells is further arranged in a plurality of ECC coverage areas, each ECC coverage area having an associated ECC code;
   an ECC generator/checker circuit, wherein the ECC generator/checker circuit is configured to error check data read from a selected ECC coverage area utilizing its associated ECC code; and
   control circuitry, wherein the control circuitry is configured to adjust a size of one or more of the ECC coverage areas.

18. A memory system, comprising:
   at least one memory device, wherein the at least one memory device contains an array of memory cells arranged in a plurality of sectors, wherein the array of memory cells is further arranged in a plurality of ECC coverage areas, each ECC coverage area having an associated ECC code; and
   a memory control circuit coupled to the at least one memory device, wherein the memory control circuit comprises:

an ECC generator/checker circuit, wherein the ECC generator/checker circuit is configured to error check data read from a selected ECC coverage area of the at least one memory device utilizing its associated ECC code;

wherein the memory control circuit is configured to adjust a size of one or more of the ECC coverage areas.

19. The memory system of claim 18, wherein the ECC generator/checker circuit is configured to generate an ECC code for data to be written to a selected ECC coverage area of the at least one memory device by the memory control circuit.

20. The memory system of claim 18, wherein the memory control circuit is configured to correct data read from the selected read ECC coverage area utilizing the associated ECC code as it is read from the at least one memory device.

* * * * *